United States Patent
Balasubramonian et al.

(10) Patent No.: US 7,266,145 B2
(45) Date of Patent: Sep. 4, 2007

(54) ADAPTIVE SIGNAL EQUALIZER WITH ADAPTIVE ERROR TIMING AND PRECURSOR/POSTCURSOR CONFIGURATION CONTROL

(75) Inventors: Venugopal Balasubramonian, San Jose, CA (US); Jishnu Bhattacharjee, San Jose, CA (US); Edem Ibragimov, San Jose, CA (US); Debanjan Mukherjee, San Jose, CA (US); Abhijit Phanse, Santa Clara, CA (US); Abhijit G. Shanbhag, San Jose, CA (US); Qian Yu, Cupertino, CA (US)

(73) Assignee: Scintera Networks, Inc., San Jose, CA (US)

(*) Notice: Subject to any disclaimer, the term of this patent is extended or adjusted under 35 U.S.C. 154(b) by 792 days.

(21) Appl. No.: 10/321,876

(22) Filed: Dec. 17, 2002

(65) Prior Publication Data

US 2004/0091037 A1    May 13, 2004

Related U.S. Application Data

(63) Continuation-in-part of application No. 10/290,993, filed on Nov. 8, 2002.

(51) Int. Cl.
*H03H 7/30* (2006.01)
*H03H 7/40* (2006.01)
*H03K 5/159* (2006.01)

(52) U.S. Cl. .............. 375/232; 375/233; 375/231; 375/340; 375/230; 375/229; 375/347; 375/234

(58) Field of Classification Search ............. 375/232, 375/233, 231, 340, 230, 229, 347, 234, 235, 375/143, 236; 360/51, 65, 46; 708/322; 348/607, 21, 466, 614
See application file for complete search history.

(56) References Cited

U.S. PATENT DOCUMENTS

| | | | |
|---|---|---|---|
| 5,191,462 A | 3/1993 | Gitlin et al. | |
| 6,668,014 B1* | 12/2003 | Endres et al. | 375/232 |
| 6,922,440 B2* | 7/2005 | Yu et al. | 375/233 |
| 6,940,898 B2* | 9/2005 | Shanbhag et al. | 375/234 |
| 7,006,565 B1* | 2/2006 | Endres et al. | 375/233 |
| 7,020,402 B2* | 3/2006 | Shanbhag et al. | 398/181 |
| 7,039,139 B1* | 5/2006 | Griffin | 375/355 |
| 2003/0189997 A1* | 10/2003 | Shanbhag et al. | 375/348 |
| 2003/0189998 A1* | 10/2003 | Phanse et al. | 375/348 |
| 2004/0091041 A1* | 5/2004 | Shanbhag et al. | 375/234 |

OTHER PUBLICATIONS

Meyr et al., Chapter 5-Synthesis of Synchronization Algorithms, Digital Communication Receivers, Synchronization, Channel Estimation, and Signal Processing, 1998, pp. 271-323, John Wiley & Sons, Inc.

* cited by examiner

*Primary Examiner*—David C. Payne
*Assistant Examiner*—Nader Bolourchi
(74) *Attorney, Agent, or Firm*—Vedder, Price, Kaufman & Kammholz, P.C.

(57) ABSTRACT

An adaptive signal equalizer with a feedforward filter in which the feedback error signal and corresponding incoming data signal are dynamically aligned in time using signal interpolation, and further, to control the precursor/postcursor filter taps configuration, thereby producing more adaptive filter tap coefficient signals for significantly improved and robust signal equalization.

29 Claims, 6 Drawing Sheets

ADAPTIVE SIGNAL EQUALIZER WITH ADAPTIVE ERROR TIMING AND PRECURSOR/POSTCURSOR CONFIGURATION CONTROL

RELATED APPLICATIONS

This is a continuation-in-part of U.S. patent application Ser. No. 10/290,993, filed Nov. 8, 2002.

BACKGROUND OF THE INVENTION

1. Field of the Invention

The present invention relates to signal transmission and detection, and in particular to adaptive signal equalization for compensation of signal distortions caused by signal dispersion and nonlinearities within signal transmission media.

2. Description of the Related Art

Signal processing architectures for mitigation of different kinds of channel impairments and/or timing recovery and synchronization functions as used for communications transmission and/or storage systems can be divided into two categories: (1) discrete-time architecture (this architecture uses a sampled approach to convert the input continuous-time, analog waveform into a discrete signal and is commonly used in current systems; typically, a high resolution analog-to-digital converter, which follows the analog anti-aliasing filter, is used as the sampler at the analog front end); and (2) continuous-time architecture (this architecture is an analog continuous-time approach which directly processes the incoming analog waveform for mitigating channel impairments or timing recovery functions while remaining in the continuous time domain until the final data bit stream is generated).

In continuous-time and discrete-time signal processing architectures for adaptive equalization with LMS-based adaptation, the filter tap coefficients may be adapted based on a continuous-time or discrete-time basis based on the correlation of the error signal (as computed as the difference between the slicer output and time-aligned slicer input) and the corresponding time-aligned data signal input to the tap. It is then necessary to time-align the error signal and data signal and reduce any performance degradation that would otherwise arise. It is also commonly a design parameter to split the precursor and postcursor taps on the feedforward filter, whether operating alone or with decision feedback. Thus, a method which can explicitly control this within the adaptive equalizer would be desirable.

Fractional-spaced feedforward filters have commonly been used either as stand-alone linear equalizers or in combination with decision feedback. The adaptation technique for the tap coefficients implicitly assume independence in the adaptation of the successive tap coefficients, which has been based on minimizing the mean squared error (as computed as the difference between the slicer input, or pre-slice, signal and slicer output, or post-slice, signal). This adaptation technique is referred to as least mean square error (LMSE) or minimum mean square error (MMSE) adaptation. It can be shown that the LMSE adaptation for both fractional feedforward or symbol spaced feedback at iteration k+1 reduces to the following coefficient update equations:

$$\underline{c} = \int_0^t \mu \cdot e(t) \underline{s}(t) dt \quad \text{(continuous-time adaptation case)}$$

where $\underline{c}$ is the tap coefficient vector and $e(t)$ the corresponding error (between delay-aligned slicer input and output), $\underline{s}$ is the vector with components as the input waveform to the corresponding tap mixer and time-aligned with the error signal appropriately and $\mu$ is a constant and is an adaptation parameter. Specifically, we have $$c_i = \int_0^t \mu \cdot e(t) \cdot s(t - i \cdot \tau) dt$$

It can be important to time-align and reduce any time mismatch between the signals $e(t)$ and $s(t-i\cdot\tau)$, as otherwise the tap coefficients tend to "drift" towards the first or last taps depending on the direction of the timing mismatch. This generally results in a change in the split of precursor and postcursor taps during adaptation and can result in significant "eye" opening penalties.

Conventional techniques for configuring the split of precursor and postcursor taps for an adaptive feedforward equalizer set the initial conditions on the feedforward taps appropriately. Apart from the "coefficient drift" reasons in cases of timing mismatches between the signals $e(t)$ and $s(t-i\cdot\tau)$ for adapting the tap coefficient $c_i$, the regular coefficient adaptation can also result in changes in the precursor/postcursor split in the feedforward equalizer. To time-align the signals $e(t)$ and $s(t-I\cdot\tau)$, conventional designs set a fixed, static timing offset for the error signal. This is not sufficiently effective if the delays along the various components in the signal data path are not accurately known or if they vary with time.

Referring to FIG. 1, a conventional adaptive signal equalizer 10 includes a feedforward filter 12, an adaptive coefficients generator 14 and an output signal slicer 16. Additionally, if decision feedback equalization is desired, a feedback filter 20 further filters the final output signal 17 from the slicer 16 to provide a feedback signal 21 which is combined in a signal combiner 22 (e.g., signal summing circuit) with the initially equalized signal 13 provided by the feedforward filter 12. The resulting equalized signal 13/23 is sliced by the signal slicer 16 to produce the output signal 17.

An additional signal combining circuit 18 combines the input 13/23 and output 17 signals of the slicer 16 to provide the error signal 19 representing the difference between the pre-slice 13/23 and post-slice 17 signals. As is well known, this error signal 19 is processed by the adaptive coefficients generator 14, along with the incoming data signal 11, to produce the adaptive coefficients 15 for the feedforward filter 12.

Additionally, so as to compensate for internal signal delays $t_s$, $t_c$ within the feedforward filter 12 and signal slicer 16, signal delay circuits 24s, 24e can be included in the signal paths for the incoming data signal 11 and pre-slice signal 13/23.

Referring to FIG. 2, a conventional feedforward filter 12 processes the incoming data signal 11 to produce the equalized signal 13 using a series of signal delay elements 32, multiplier circuits 34 and output summing circuit 36 in accordance with well-known techniques. Each of the successively delayed versions 33a, 33b, ..., 33n, as well as the incoming data signal 11, is multiplied in one of the multiplication circuits 34a, 34b, 34c, ..., 34n with its respective adaptive coefficient signal 15a, 15b, ..., 15n. The resulting product signals 35a, 35b, ..., 35n are summed in the signal summing circuit 36, with the resulting sum signal forming the equalized signal 13.

Referring to FIG. 3, a conventional adaptive coefficients generator 14 processes the incoming data signal 11 and feedback error signal 19 using a series of signal delay elements 42, signal multipliers 44 and signal integrators (e.g., low pass filters) 46 in accordance with well known techniques. The incoming signal 11 is successively delayed by the signal delay elements 42a, 42b, ..., 42n to produce successively delayed versions 43a, 43b, ..., 43n of the incoming signal 11. Each of these signals 11, 43a, 43b, ..., 43n is multiplied in its respective signal multiplier 44a, 44b, ..., 44n with the feedback error signal 19. The resulting product signals 45a, 45b, ..., 45n are individually integrated in the signal integration circuits 46a, 46b, ..., 46n to produce the individual adaptive coefficient signals 15a, 15b, ..., 15n.

SUMMARY OF THE INVENTION

In accordance with the presently claimed invention, an adaptive signal equalizer includes a feedforward equalizer in which the feedback error signal and corresponding incoming data signal are dynamically aligned in time using signal interpolation, thereby producing more adaptive filter tap coefficient signals for significantly improved signal equalization. By dynamically minimizing timing mismatches between the feedback error signal and corresponding incoming data signal, advantages realized with the presently claimed invention include substantial avoidance of "drifting" of the adaptive filter tap coefficient signals as well as changes in the precursor/postcursor split in the feedforward equalizer, even with unknown or varying signal delays within the various signal path elements.

As will become evident from the following discussion, the presently claimed invention can be implemented and practiced in either the continuous time (e.g., analog) or discrete time (e.g., digital) domain. At the present point in time, data symbol rates less than one gigabit per second (1 Gb/s) can often be processed in either the continuous or discrete time domain, while data symbol rates greater than 1 Gb/s must generally be processed in the continuous time domain. However, as the applicable technology advances, it is expected that data symbol rates in excess of 1 Gb/s will also become more susceptible to processing in the discrete time domain as well. As will become further evident, the presently claimed invention benefits the host system or network by effectively increasing the signal-to-noise ratio (SNR), thereby reducing the bit error rate (BER) and, in turn, adding robustness (e.g., with respect to phase offsets or jitter among the data symbols). For example, in the case of a fiber optic network, such added performance and robustness will allow a longer network to be realized without a concomitant increase in network infrastructure.

In accordance with one embodiment of the presently claimed invention, an adaptive signal equalizer includes adaptive equalization circuitry, signal slicer circuitry and adaptive coefficient signal generator circuitry. The adaptive equalization circuitry receives at least a plurality of adaptive coefficient signals and in response thereto receives and equalizes an input data signal to provide an equalized signal. The signal slicer circuitry, coupled to the adaptive equalization circuitry, receives and slices the equalized signal to provide a sliced signal and a difference signal corresponding to a difference between the equalized signal and the sliced signal. The adaptive coefficient signal generator circuitry, coupled to the signal slicer circuitry and the adaptive equalization circuitry: receives the input data signal and the difference signal and processes one of the input data signal and the difference signal to provide first and second aligned signals which are substantially temporally aligned; and processes the first and second aligned signals together to provide the plurality of adaptive coefficient signals.

In accordance with another embodiment of the presently claimed invention, a method for adaptive signal equalizing includes:

receiving at least a plurality of adaptive coefficient signals and in response thereto receiving and equalizing an input data signal to generate an equalized signal;

slicing the equalized signal to generate a sliced signal and a difference signal corresponding to a difference between the equalized signal and the sliced signal;

processing one of the input data signal and the difference signal to generate first and second aligned signals which are substantially temporally aligned; and processing the first and second aligned signals together to generate the plurality of adaptive coefficient signals.

DETAILED DESCRIPTION OF THE INVENTION

Figure 1:
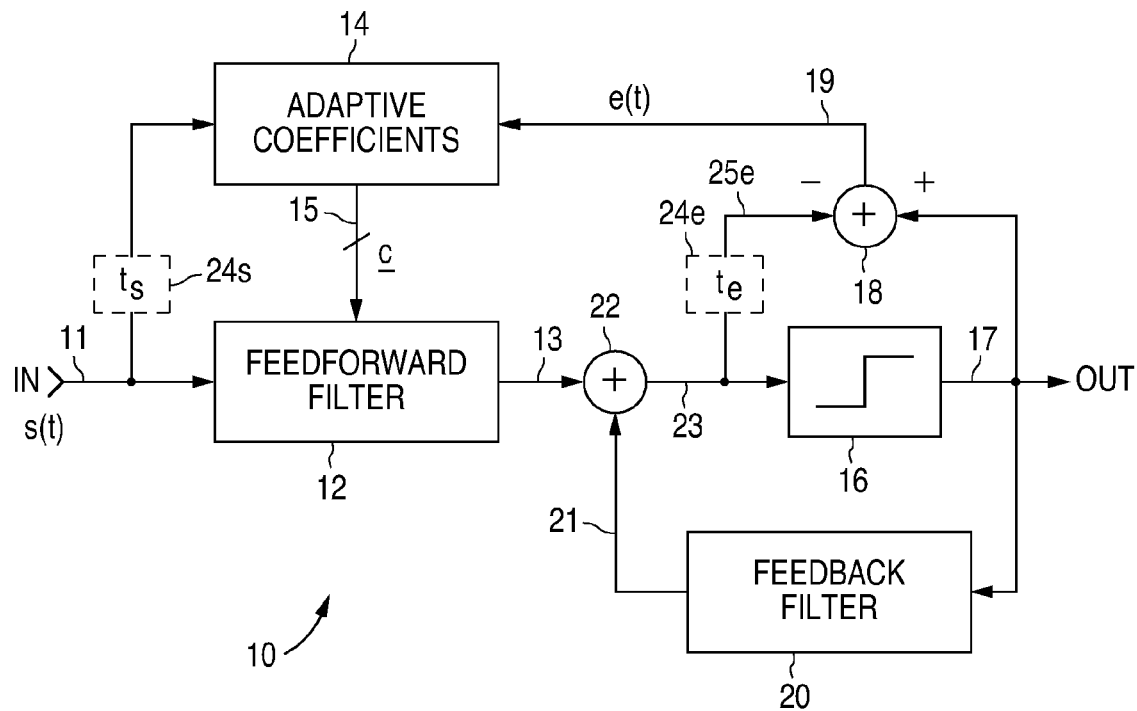
FIG. 1 is a block diagram of a conventional adaptive signal equalizer that includes decision feedback equalization.
Figure 2:
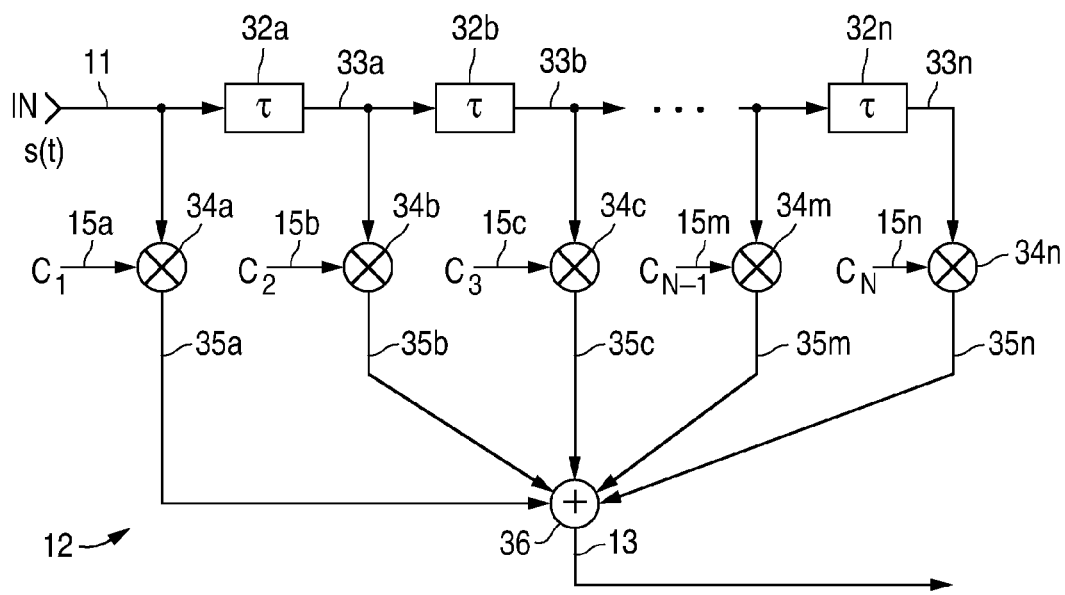
FIG. 2 is a block diagram of a conventional feedforward filter.
Figure 3:
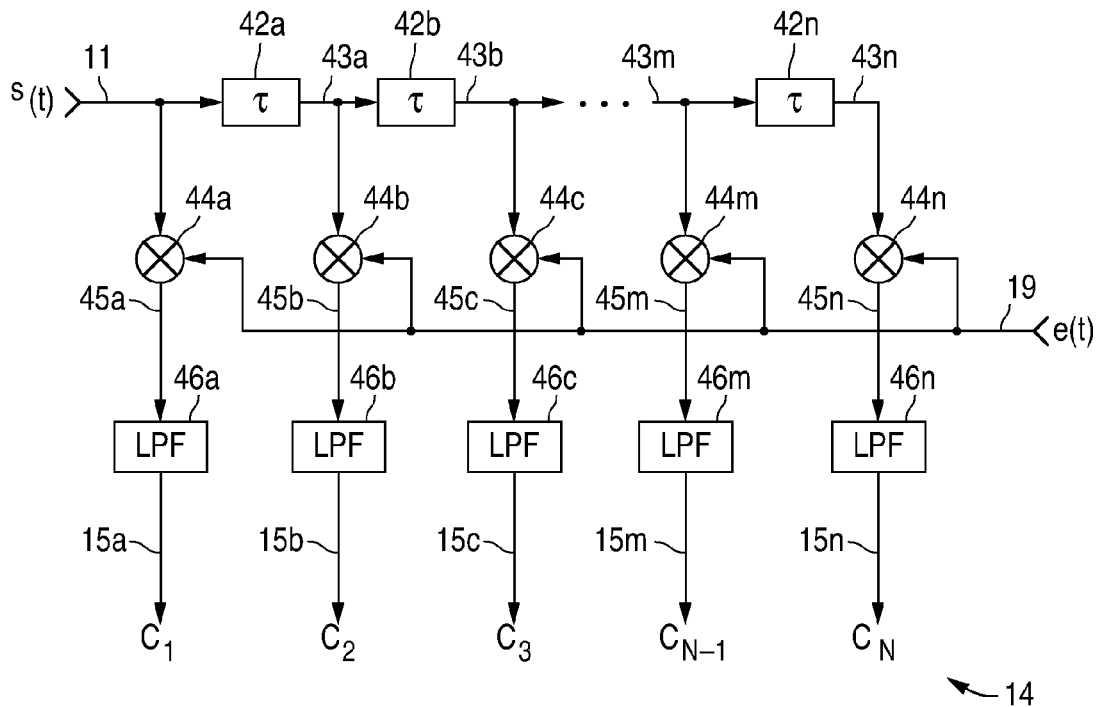
FIG. 3 is a block diagram of a conventional adaptive coefficients generator.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

The subject matter discussed herein, including the presently claimed invention, is compatible and suitable for use with the subject matter disclosed in the following copending, commonly assigned patent applications (the disclosures of which are incorporated herein by reference): U.S. patent application Ser. No. 10/117,293, filed Apr. 5, 2002, and entitled "Compensation Circuit For Reducing Intersymbol Interference Products Caused By Signal Transmission Via Dispersive Media"; U.S. patent application Ser. No. 10/179,689, filed Jun. 24, 2002, and entitled "Crosstalk Compensation Engine For Reducing Signal Crosstalk Effects Within A Data Signal"; U.S. patent application Ser. No. 10/244,500, filed Sep. 16, 2002, and entitled "Compensation Method For Reducing Intersymbol Interference Products Caused By Signal Transmission Via Dispersive Media"; U.S. patent application Ser. No. 10/290,674, filed Nov. 8, 2002, and entitled "Compensation Circuit And Method For Reducing Intersymbol Interference Products Caused By Signal Transmission Via Dispersive Media"; U.S. patent application Ser. No. 10/290,57 1, filed Nov. 8, 2002, and entitled "Adaptive Coefficient Signal Generator For Adaptive Signal Equalizers With Fractionally-Spaced Feedback"; U.S. patent application Ser. No. 10/321,893, filed Dec. 17, 2002, and entitled "Adaptive Signal Latency Control For Communications Systems Signals"; U.S. patent application Ser. No. 10/322,024, filed Dec. 17, 2002, and entitled "Adaptive Coefficient Signal Generator For Adaptive Signal Equalizers With Fractionally-Spaced Feedback"; and U.S. patent application Ser. No. 10/179,996, filed Jun. 24, 2002, and entitled "Programmable Decoding of Codes of Varying Error-Correction Capability".

The methods as proposed herein extend to both, discrete-time signal processing architectures and continuous-time signal processing architectures, and simultaneously address: (1) techniques to time-align the error signal and the corresponding data signal for adapting each filter tap coefficient; and (2) techniques to configure the split of precursor and postcursor taps on the feedforward filter within an adaptive equalizer. References to this control block will in terms of error timing control and precursor/postcursor control (ETC/PPC). The discussion herein is generally for the continuous-time adaptive signal processing architecture such as by using a fractionally-spaced transversal filter.

The ETC/PPC block will be considered to be in the data path of the error signal e(t) to appropriately delay the error signal e(t) using interpolation techniques so as to time align the error signal e(t) and incoming data signal s(t−i·τ). It should be noted that similar techniques can be used if the ETC/PPC block is placed in the data path for the correlating signal s(t), in which case the correlating signal s(t) is appropriately delayed using interpolation techniques so as to time align the error signal e(t) and data signal s(t−i·τ).

The underlying theme for controlling the ETC/PPC block is to use the tap coefficients based on alternative criteria giving rise to different, though essentially similar, techniques in which alternative linear interpolation structures are used and parameterized by the timing control ratio parameter r.

Figure 4A:
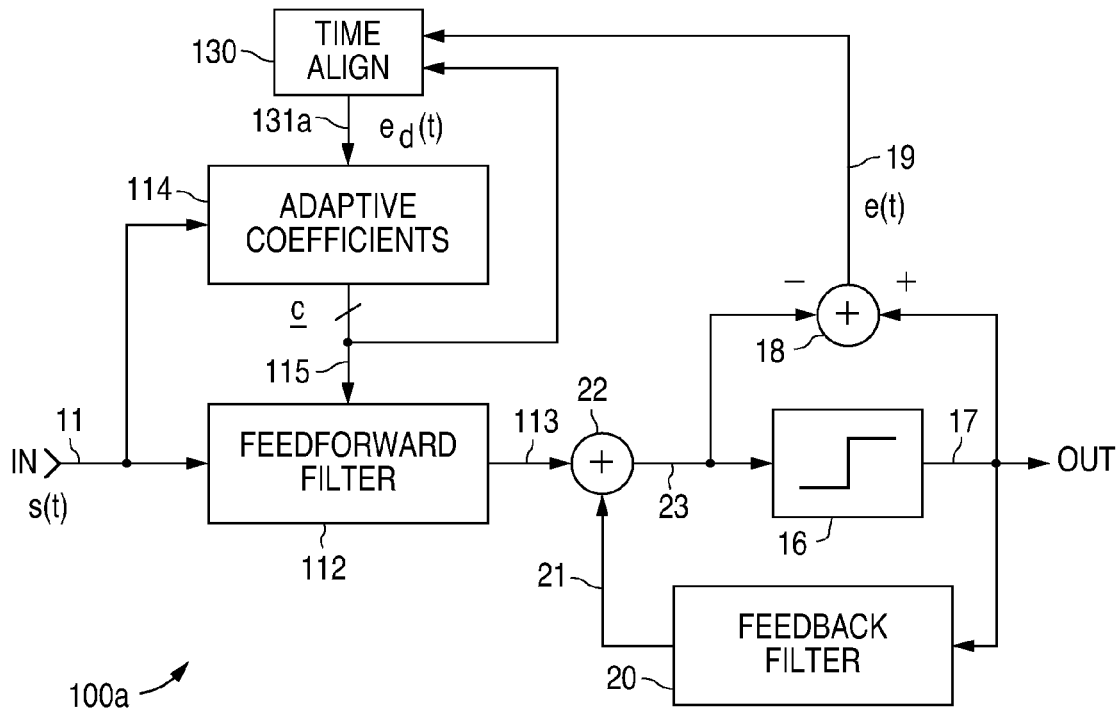
FIGS. 4A and 4B are block diagrams of alternative embodiments of an adaptive signal equalizer in accordance with the presently claimed invention.

Referring to FIG. 4A, one embodiment of an adaptive signal equalizer 100a in accordance with the presently claimed invention includes feedforward filter 112, signal slicer 16 and error signal generator 18, as discussed above. Also, a feedback filter 20 and signal combining circuit 22 can be included when decision feedback equalization (DFE) is desired.

In this embodiment 100a, the feedback error signal 19 is processed by a time alignment stage 130 to produce a dynamically time-aligned signal 131a for processing by the adaptive coefficients generator 114 with the incoming signal 11 to produce the adaptive coefficient vector 115. (The additional signal delay elements 24s, 24e for the incoming 11 and equalized 13/23 signals are not shown, but it will be readily understood that such additional compensating signal delays can be included in the adaptive coefficients generator 114 and error signal generator 18 as necessary.). As discussed in more detail below, the time alignment stage 130 interpolates and introduces a delay to the feedback error signal 19 to produce a delayed version 131a of the error signal that is in appropriate time alignment with the incoming signal 11. These signals 131a, 11 are processed in the adaptive coefficients generator 114 to produce the adaptive coefficients 115 which are also fed back and used in the time alignment stage 130 in the processing of the feedback error signal 19.

Figure 4B:
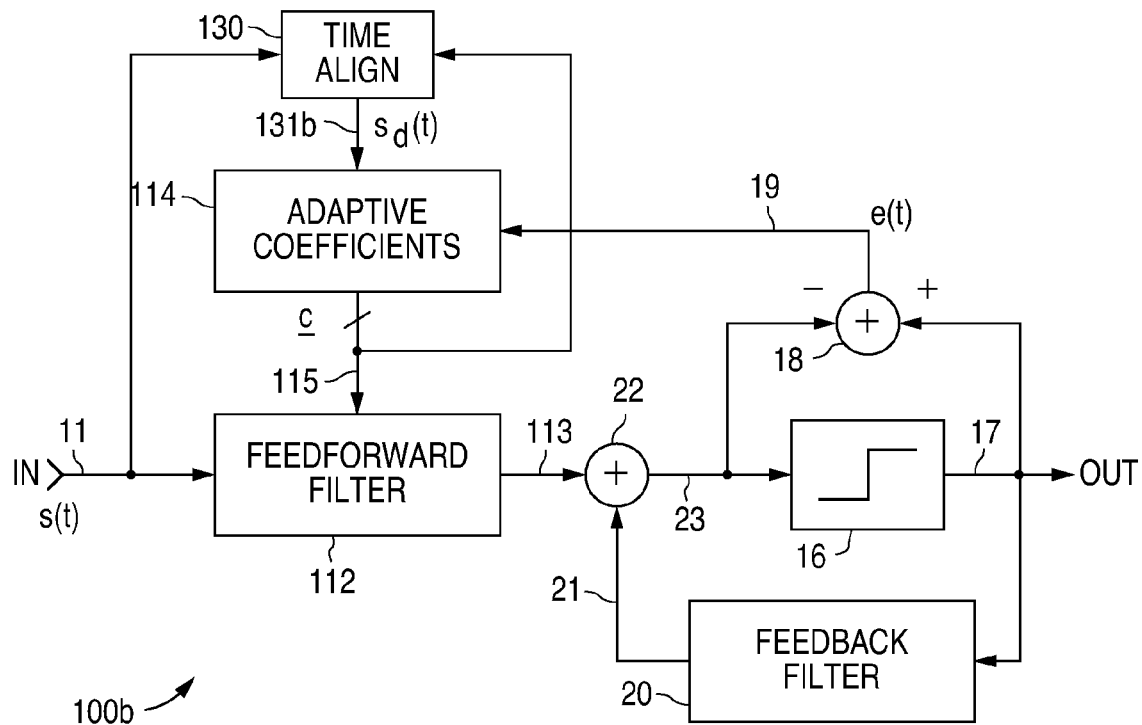

Referring to FIG. 4B, in another embodiment of an adaptive signal equalizer 100b in accordance with the presently claimed invention also temporally aligns the error signal 19 and incoming signal 11 for processing in the adaptive coefficients generator 114. However, in this embodiment 100b, the time alignment is introduced to the incoming signal 11 to produce a time-delayed version 131b for processing with the original feedback error signal 19 in the adaptive coefficients generator 114. As in the embodiment 100a of FIG. 4A, the adaptive coefficients 115, in addition to being provided to the feedforward filter 112, are also fed back for use in the time alignment stage 130.

Figure 5:
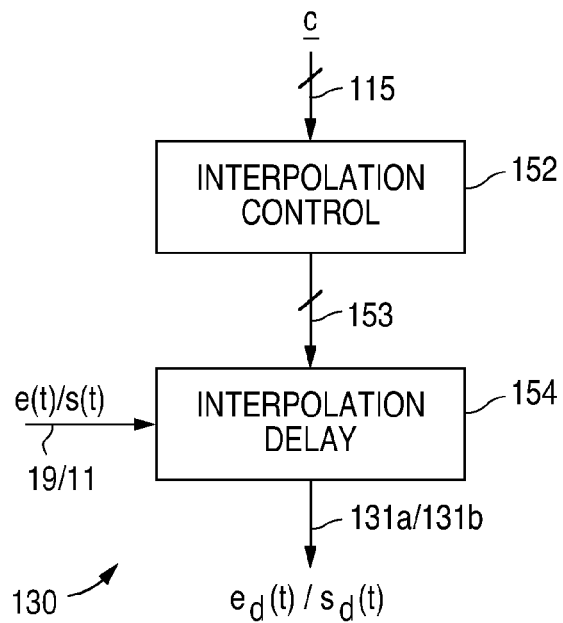
FIG. 5 is a block diagram of one embodiment of the time alignment stage in the circuits of FIGS. 4A and 4B.

Referring to FIG. 5, the time alignment stage 130 includes an interpolation control stage 152 and an interpolation delay stage 154. As discussed in more detail below, the interpolation controller 152 processes the feedback adaptive coefficients 115 to produce a set 153 of delay interpolation control signals for the interpolation delay stage 154. In response to these delay interpolation control signals 153, the interpolation delay stage 154 processes its input signal 19/11 (which, as discussed above, can be either the feedback error signal 19 or incoming data signal 11) to produce the corresponding delayed signal 131a/131b for processing by the adaptive coefficients generator 114.

Figure 6:
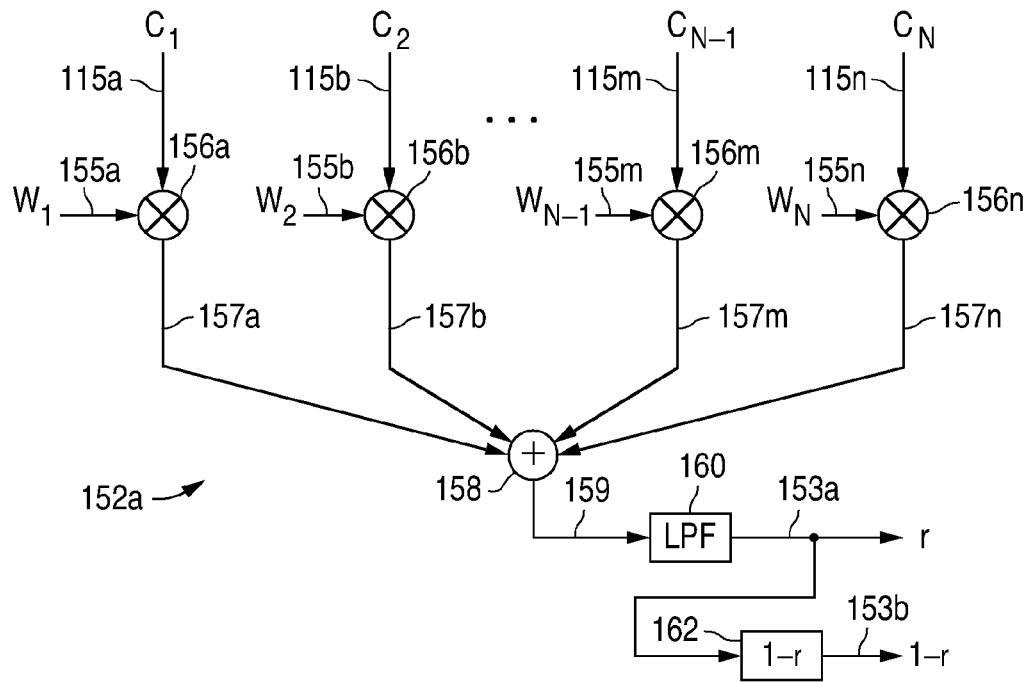
FIG. 6 is a block diagram of one embodiment of the interpolation control stage of FIG. 5.

Referring to FIG. 6, one embodiment 152a of the interpolation controller 152 in accordance with the presently claimed invention includes a set of signal multipliers 156, a signal combining circuit 158, a signal integration circuit (e.g., low pass filter) 160 and a signal complement circuit 162, interconnected substantially as shown. Each of the feedback adaptive coefficient signals 115a, 115b, ..., 115n is multiplied in a respective multiplier 156a, 156b ..., 156n with a corresponding weighted, or scaled, signal 155a, 155b, ..., 155n. The resulting product signals 157a, 157b, ... 157n are summed in the signal combiner 158. The sum signal 159 is integrated by the signal integrator 160 to produce the primary delay interpolation control signal 153a representing the timing control ratio parameter r. This delay interpolation control signal 153a is also complemented by the signal complement circuit 162 to provide the complement delay interpolation control signal 153b. This signal complement circuit 162 processes the delay interpolation control signal 153a by subtracting it from a normalized value (e.g., unity) to produce the complement signal 153b.

Figure 7:
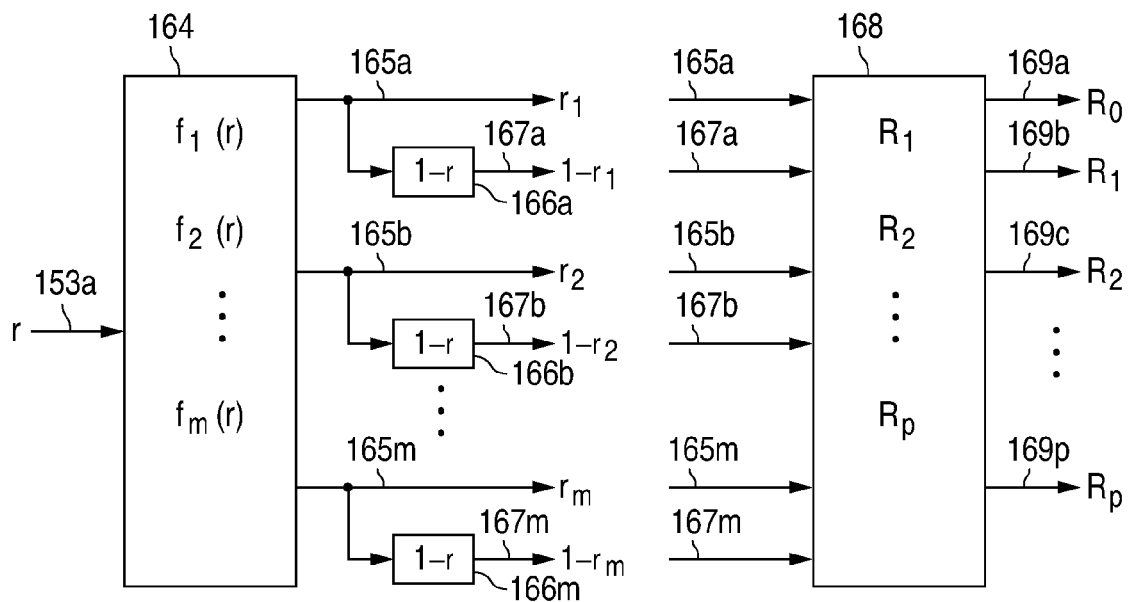
FIG. 7 is a block diagram of further processing circuitry for inclusion in the interpolation control stage of FIG. 5.

Referring to FIG. 7, as an alternative, the primary delay interpolation control signal 153a can also be processed by a multifunction signal processor 164 to produce multiple delay interpolation control signals 165a, 165b, . . . , 165n corresponding to the input signal 153a processed in accordance with various functions. Associated signal complement circuits 166a, 166b, . . . , 166m, produce corresponding complement delay interpolation control signal 167a, 167b, . . . , 167m.

These delay interpolation control signals 165a, 165b, . . . , 165m and their complement signals 167a, 167b, . . . , 167m can be further processed by another multifunction signal processor 168 to produce a further series of interpolation control signals 169a, 169b, . . . , 169p. (These interpolation control signals and their uses are discussed in more detail below.)

For example, consider a simple tapped delay line structure for the ETC/PPC with N−1 delay filters and N corresponding filter taps. One pair of adjacent taps has non-zero tap coefficients and have correlated values given by r, 1−r. The other taps have tap coefficients set to zero. (Techniques for adapting the timing control ratio parameter r are discussed in more detail below.) Thus, a pair of adjacent taps is selected so as to induce an interpolated delay on the error signal e(t) which appropriately time-aligns the signals e(t), s(t) for near-optimal tap coefficient adaptation. The next step is to determine which pair of two adjacent taps induces the most appropriate interpolated delay. The specific two adjacent taps may vary depending on the group delay variations of different analog or digital components within the feedback path, such as the slicer, delay elements, summer, mixer, etc.

One technique is to hypothesize that different successive pairs of taps induce the appropriate interpolated delay. Then, depending on the values of the feedforward tap coefficients after convergence or sufficiently large number of iterations, the delay interpolation parameter r for the correct hypothesis should ideally be within the range between zero and unity (0,1) or the hypothesis should correspond to the minimum mean squared error. The winning hypothesis may then be selected based on the above criteria as part of the start-up procedures of the equalizer.

Ideally 0<r<1, although in general −∞<r<∞. However, it should be understood that maximum advantages of timing interpolation as provided by the presently claimed invention are realized when 0<r<1 (e.g., where the complement 1−r of r when r=0.2 is 1−r=1−0.2=0.8). When r lies outside of the range (0,1), i.e., −∞<r<0 or 1<r<∞ (e.g., where the complement 1−r of r when r=1.2 is 1−r=1−1.2=−0.2), extrapolation takes place instead of interpolation and performance degradation may result. An illustration of this technique, with three delay filters within the ETC/PPC and the winning hypothesis with the second and third taps as the non-zero taps can be described as follows.

Figure 8:
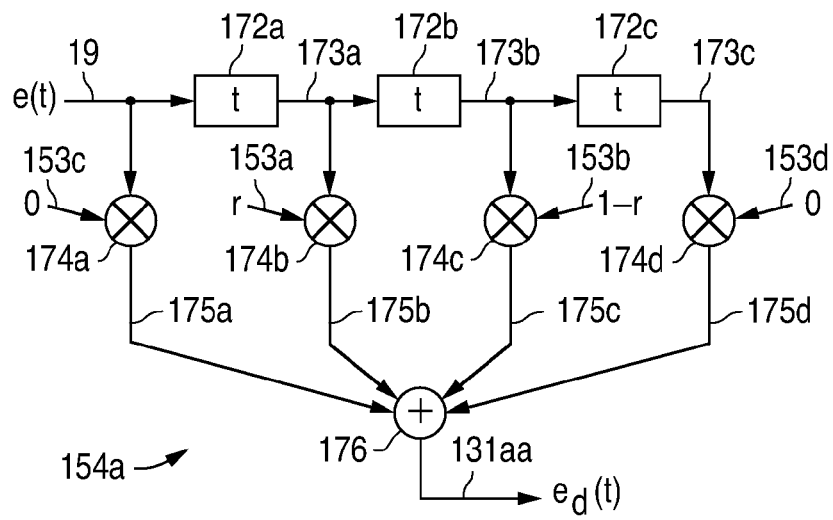
FIGS. 8, 9, 10A, 10B and 10C are block diagrams of alternative embodiments of the interpolation delay stage of FIG. 5.

Referring to FIG. 8, one embodiment 154a of the interpolation delay stage 154 in accordance with the presently claimed invention, as discussed above, includes three signal delay elements 172a, 172b, 172c. The incoming signal, the feedback signal error signal 19 in this example, and the corresponding successively time-delayed versions 173a, 173b, 173c are multiplied in signal multipliers 174a, 174b, 174c, 174d with interpolation control signals 153a, 153b, 153c, 153d. The resulting product signals 175a, 175b, 175c, 175d are summed in a signal combiner 176 to produce the delayed version 131aa of the incoming signal 19.

Another technique which may not need such hypothesis testing and, thus, may be more robust in some scenarios uses a ladder-type of structure. However, the minimum group delay induced by the ETC/PPC may be increased due to the presence of cascaded summers and mixers. This ladder-type structure can be described as follows (note that ETC/PPC spans three delay filters in this example).

Figure 9:
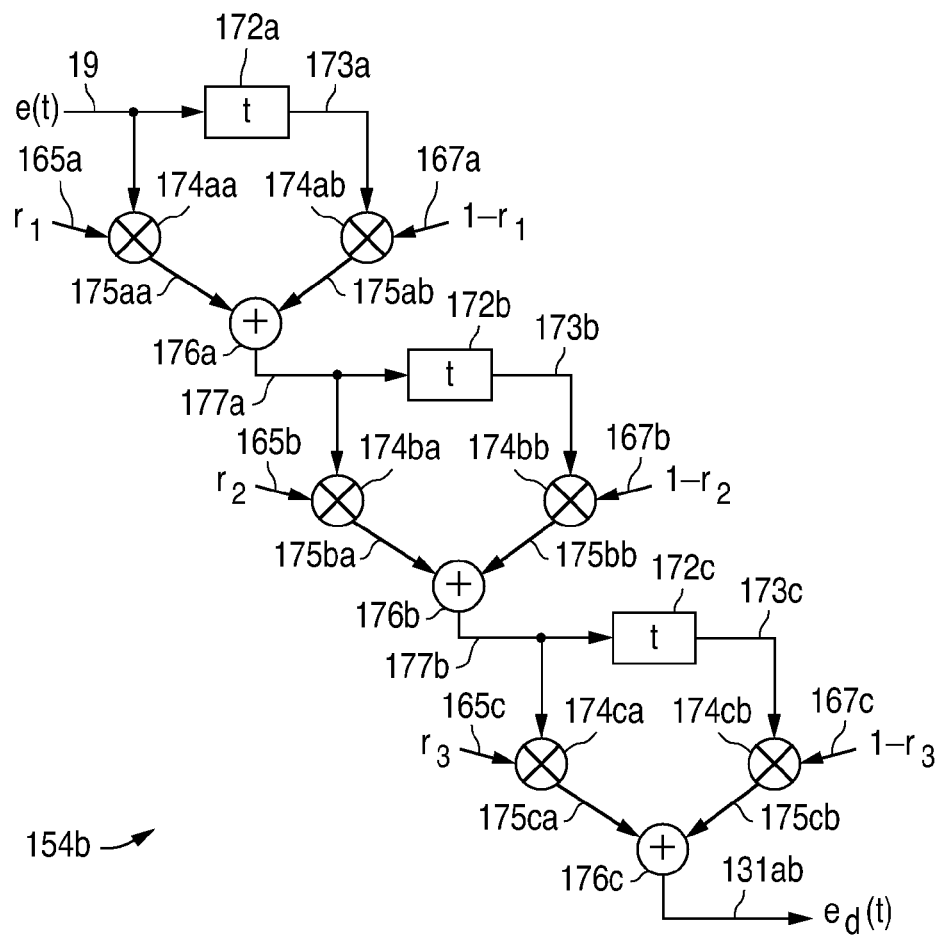

Referring to FIG. 9, an alternative embodiment 154b of the interpolation delay stage 154 in accordance with the presently claimed invention is implemented as a ladder-type structure as shown. The incoming signal 19 is delayed by a signal delay element 172a. The incoming signal 19 and its delayed version 173a are multiplied in signal multipliers 174aa, 174ab with the first set of delay interpolation control signals 165a, 167a. The resulting product signals 175aa, 175ab are summed in a signal combiner 176a. The resulting sum signal 177a, as well as a successive sum signal 177b (generated in a similar manner) are similarly processed in similar successive circuitry to produce the final delayed version 131ab of the incoming signal 19.

In the general case, the timing control ratio parameters $r_1$, $r_2$, $r_3$, can be obtained as follows:

$$r_1 = f_1(r); r_2 = f_2(r); r_3 = f_3(r)$$

for appropriate functions $f_1(\cdot)$, $f_2(\cdot)$, $f_3(\cdot)$. In one embodiment, the timing control ratio parameters $r_1, r_2, r_3$, can be selected as follows:

$$r_1 = r_2 = r_3 = r$$

In another embodiment, the timing control ratio parameters $r_1, r_2, r_3$, can be selected as follows:

$$r_1 = \text{clip}(r); r_2 = \text{clip}(r+1); r_3 = \text{clip}(r+2)$$

where the function clip(·) is defined as follows:

$$\text{clip}(x) = \begin{cases} 0; & \text{if } x \leq 0 \\ x; & \text{if } 0 \leq x \leq 1 \\ 1; & \text{if } 1 \leq x \end{cases}$$

Figure 10A:
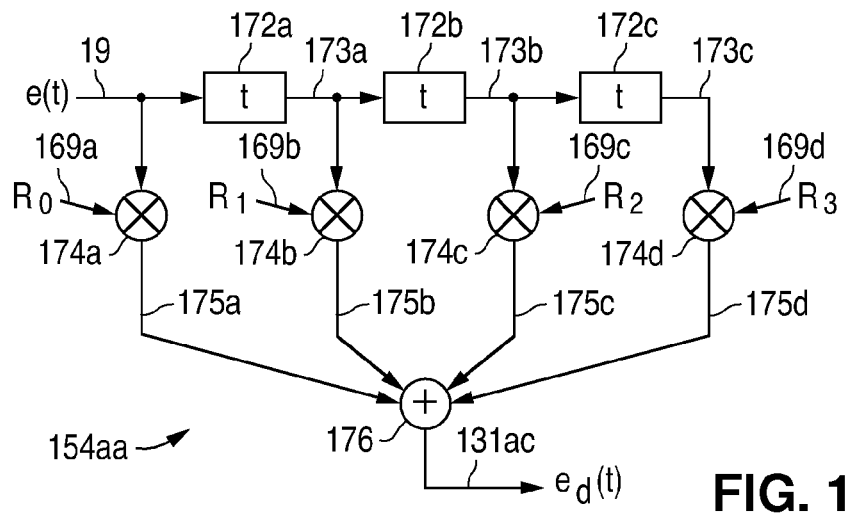

Referring to FIG. 10A, another embodiment 154aa retains the robustness of the embodiment 154b of FIG. 9 since the need for hypothesis testing is obviated while the minimum group delay induced by the ETC/PPC is not increased beyond that of the embodiment 154a of FIG. 8. As illustrated, for the case of three taps, and very readily generalized for higher or smaller number of taps, within the ETC/PPC, this embodiment also uses a tapped-delay where multiple (>2) taps may be non-zero.

The parameters $R_0$, $R_1$, $R_2$, $R_3$, in this embodiment 154aa are related to the parameters $r_1, r_2, r_3$, described in the embodiment 154b of FIG. 9 as follows:

$$R_0 = r_1 \cdot r_2 \cdot r_3;$$

$$R_1 = (1-r_1) \cdot r_2 \cdot r_3 + r_1 \cdot (1-r_2) \cdot r_3 + r_1 \cdot r_2 \cdot (1-r_3);$$

$$R_2 = (1-r_1) \cdot (1-r_2) \cdot r_3 + (1-r_1) \cdot r_2 \cdot (1-r_3) + r_1 \cdot (1-r_2) \cdot (1-r_3);$$

$$R_3 = (1-r_1) \cdot (1-r_2) \cdot (1-r_3).$$

Note that in this case, or in the general case, the taps may all be parameterized by the timing interpolation parameter r and adapt in a correlated manner as different functions of r.

Figure 10B:
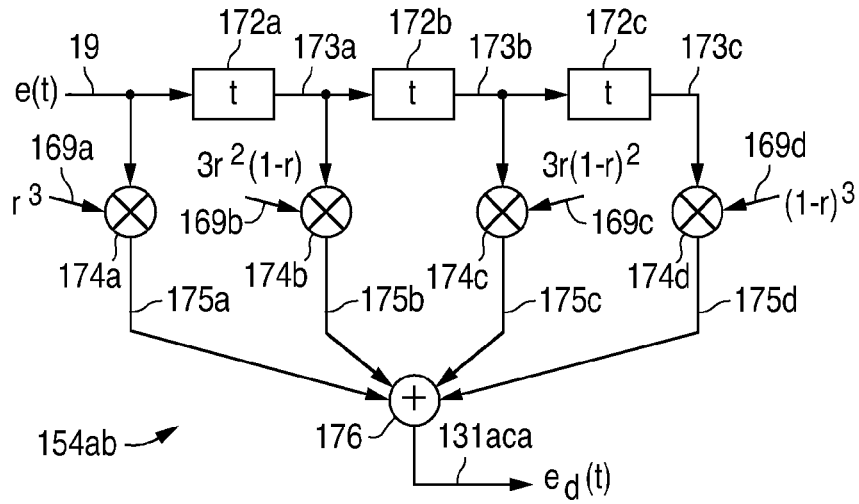

Referring to FIG. 10B, in another embodiment 154$ab$ where $r_1=r_2=r_3=r$, the embodiment 154$aa$ of FIG. 10A can be implemented as shown.

Figure 10C:
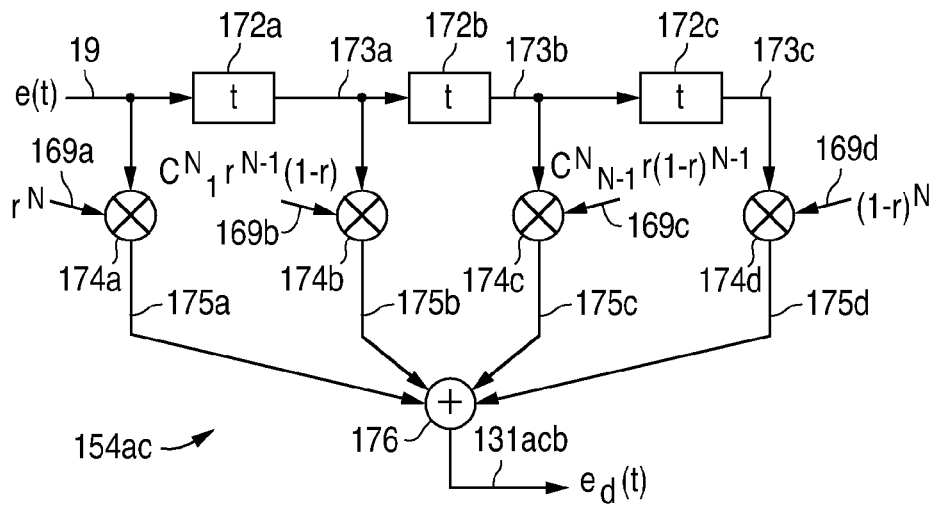

Referring to FIG. 10C, another embodiment 154$ac$ corresponding to the more general case with N–1 delays filters and with each parameter $r_i$ set equal to r within the ETC/PPC can be implemented as shown, where $$C_i^N = \frac{N!}{(N-i)!i!}$$

are the binomial coefficients.

In the case where $r_1$=clip(r);$r_2$=clip(r+1);$r_3$=clip(r+2), parameters $R_0, R_1, R_3$, can be reduce as follows (this case may also be readily generalized to cases with more or fewer delay filters in the ETC/PPC):

$R_0$=clip($r$);$R_1$=clip(1+$r$)–clip($r$);$R_2$=clip(2+$r$)– clip (1+$r$);$R_3$=1–clip(2+$r$)

Alternative techniques for controlling the timing ratio parameter r of the ETC/PPC using the tap coefficients based on different criteria can be as described as follows.

Symmetrization Criterion

Under this criterion, the parameter r is adapted based on achieving a measure of symmetry about a pre-selected center tap or group of center taps. For example, if $\{c_i\}_{i=1}^N$ are the set of tap coefficients for the feedforward filter, $C_{N+1/2}$ can be selected as the center tap if N is odd. The adaptation update of the parameter r may then be selected as follows:

$$\Delta r = \sum_{i=1}^{\frac{N-1}{2}} c_i - \sum_{i=\frac{N+3}{2}}^{N} c_i$$

and r=$\beta \cdot$r–$\mu \cdot \Delta$r with discrete-time update, or $$r = \mu \cdot \int_0^\tau \Delta r$$

with continuous-time update and $\mu,\beta$ are adaptation parameters. The above expression for the increments in the parameter r may also be generalized to be of the form:

$$\Delta r = \sum_{i=1}^{\frac{N-1}{2}} w_i c_i - \sum_{i=\frac{N+3}{2}}^{N} w_i c_i,$$

for certain real numbers $\{w_i\}$ which may be fixed or variable. There may be certain design constraints on $\{w_i\}$. For example, in the above case, $w_i$=$w_{N+1-i}$ may be selected. In the case that N is even, the following selection may be made:

$$\Delta r = \sum_{i=1}^{\frac{N}{2}} w_i c_i - \sum_{i=\frac{N}{2}+1}^{N} w_i c_i.$$

The above examples for selecting the parameter $\Delta$r are generally more applicable to a feedforward filter without decision feedback and in which the precursor and post-cursor taps are set to be equal. In the presence of decision feedback, the design choice of precursor and post-cursor taps may be quite different and the center tap may need to be selected significantly off-center (i.e., different from the tap indexed by N/2 or N±1/2). Thus, if the center tap is selected for indexing by L, which corresponds to L–1 precursor taps and N–L post-cursor taps, the following selection may be made:

$$\Delta r = \sum_{i=1}^{L-1} w_i c_i - \sum_{i=L+1}^{N} w_i c_i.$$

LMS with Static Convergence Criterion

Under this criterion, the parameter r can be adapted based on LMS criterion applied to the error e(t). Using this criterion and repeatedly using the linearity of the error e(t) within an interval of $\tau$, it may be shown that the adaptation update of r is given as follows (with one approximation):

$$\Delta r = \sum_{i=0}^{N} [r \cdot \delta c_1 \cdot (c_i - c_{i-1}) + (1-r) \cdot \delta c_i \cdot (c_{i+1} - c_i)]$$

and r=$\beta \cdot$r–$\mu \cdot \Delta$r with discrete-time update, or $$r = \mu \cdot \int_0^\tau \Delta r$$

with continuous-time update and $\mu,\beta$ are adaptation parameters. Also, in this example N+1 is the number of feedforward taps and $\{c_i\}$ is the set of feedforward tap coefficients. Alternatively, treating the above difference as a differential, a corresponding integral form for adapting the parameter r is obtained.

Group Delay Criterion

Under this criterion, a designed group delay is selected and $\Delta$r is controlled to maintain such selected group delay. For convenience of analysis in this case, it is assumed that the center tap is indexed by $c_0$, the precursor taps are $c_{-L_1}, c_{-L_1+1}, \ldots c_{-1}$ and the post-cursor taps are $c_1, c_2, \ldots, c_{L_2}$. The total number of taps are N+1=$L_1$+$L_2$+1. The total group delay through the feedforward finite impulse response (FIR) filter relative to the center tap may then be shown approximately to be:

$$\tau_{gd} = \frac{\sum_{i=-L_1}^{i=L_2} i \cdot c_i}{\sum_{i=-L_1}^{i=L_2} c_i}.$$

It may be desirable to set the ETC/PPC so that the group delay is generally close to zero so as to maintain the split of precursor and postcursor taps on the feedforward filter. Thus, with this criterion, $$\Delta r = \frac{\sum_{i=-L_1}^{i=L_2} i \cdot c_i}{\sum_{i=-L_1}^{L_2} c_i} \text{ or } \Delta r = \sum_{i=-L_1}^{i=L_2} i \cdot c_i$$

and $r = \beta \cdot r - \mu \cdot \Delta r$ with discrete-time update, or $$r = \mu \cdot \int_0^\tau \Delta r$$

with continuous-time update and $\mu, \beta$ are adaptation parameters.

Enhancements and Modifications

Enhancements or modifications may be introduced to improve the performance over the ETC/PPC as discussed above, such as multi-point linear interpolation for the ETC/PPC, or multi-point ETC/PPC with superlinear interpolation.

For multi-point linear interpolation for the ETC/PPC, multiple taps (more than two) may be used within the ETC/PPC. A simple but effective approach in such case is to provide multiple stages of linear interpolation, with each stage consisting of a linear interpolation between some two points obtained from the earlier stage to give a new point which may be used in the next stage. Each stage may now use an ETC/PPC with a different timing control ratio parameter r which may be selected with different criteria, such as different target group delays over different stages.

For multi-point ETC/PPC with superlinear interpolation, while the discussion herein generally considers linear interpolation, more general interpolation may be employed, especially when multiple taps (more than two) are used within the ETC/PPC, such as quadratic, cubic interpolation, etc.

Based upon the foregoing discussion, it should be recognized that each of the exemplary embodiments of the presently claimed invention as depicted and discussed herein offer similar advantages without any one of such embodiments necessarily being preferred over the others. As will be readily appreciated by one of ordinary skill in the art, the particular topology of each embodiment may cause one particular embodiment to be deemed more advantageous for the specific host system or network in which such embodiment is to be implemented (e.g., due to circuit design rules or layout constraints).

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an adaptive signal equalizer, comprising:

adaptive equalization circuitry that receives at least a plurality of adaptive coefficient signals and in response thereto receives and equalizes an input data signal to provide an equalized signal;

signal slicer circuitry, coupled to said adaptive equalization circuitry, that receives and slices said equalized signal to provide a sliced signal and a difference signal corresponding to a difference between said equalized signal and said sliced signal; and adaptive coefficient signal generator circuitry, coupled to said signal slicer circuitry and said adaptive equalization circuitry, that receives said input data signal and said difference signal and processes one of said input data signal and said difference signal to provide first and second aligned signals which are substantially temporally aligned, and processes said first and second aligned signals together to provide said plurality of adaptive coefficient signals, wherein said adaptive coefficient signal generator circuitry comprises:

signal delay interpolation circuitry that receives said plurality of adaptive coefficient signals and in response thereto receives and interpolates said one of said input data signal and said difference signal to provide an interpolated delayed signal; and first signal combining circuitry, coupled to said signal delay interpolation circuitry, that receives and combines said interpolated delayed signal and another of said input data signal and said difference signal to provide said plurality of adaptive coefficient signals.

2. The apparatus of claim 1, wherein said signal delay interpolation circuitry comprises:

interpolation control circuitry that receives and processes said plurality of adaptive coefficient signals and a plurality of weighted coefficient signals to provide at least one delay interpolation control signal; and interpolation delay circuitry, coupled to said interpolation control circuitry, that receives said at least one delay interpolation control signal and in response thereto receives and interpolates said one of said input data signal and said difference signal to provide said interpolated delayed signal.

3. The apparatus of claim 2, wherein said at least one delay interpolation control signal comprises first and second delay interpolation control signals, and said second delay interpolation control signal is a complement of said first delay interpolation control signal.

4. The apparatus of claim 2, wherein said interpolation control circuitry comprises:

signal multiplication circuitry that receives and multiplies said plurality of adaptive coefficient signals and said plurality of weighted coefficient signals to provide a plurality of product signals;

second signal combining circuitry, coupled to said signal multiplication circuitry, that receives and combines said plurality of product signals to provide a combined signal; and signal integration circuitry, coupled to said second signal combining circuitry, that receives and integrates said combined signal to provide a first one of said at least one delay interpolation control signal.

5. The apparatus of claim 4, further comprising signal complement circuitry, coupled to said signal integration circuitry, that receives and complements said first one of said at least one delay interpolation control signal to provide a second one of said at least one delay interpolation control signal.

6. The apparatus of claim 2, wherein said interpolation control circuitry comprises:
   signal multiplication circuitry that receives and multiplies said plurality of adaptive coefficient signals and said plurality of weighted coefficient signals to provide a plurality of product signals;
   second signal combining circuitry, coupled to said signal multiplication circuitry, that receives and combines said plurality of product signals to provide a combined signal;
   signal integration circuitry, coupled to said second signal combining circuitry, that receives and integrates said combined signal to provide an integrated signal; and
   multifunction processing circuitry, coupled to said signal integration circuitry, that receives and processes said integrated signal to provide a first plurality of delay interpolation control signals as a portion of said at least one delay interpolation control signal.

7. The apparatus of claim 6, further comprising signal complement circuitry, coupled to said multifunction processing circuitry, that receives and complements said first plurality of delay interpolation control signals to provide a second plurality of delay interpolation control signals as another portion of said at least one delay interpolation control signal.

8. The apparatus of claim 2, wherein said interpolation control circuitry comprises:
   signal multiplication circuitry that receives and multiplies said plurality of adaptive coefficient signals and said plurality of weighted coefficient signals to provide a plurality of product signals;
   second signal combining circuitry, coupled to said signal multiplication circuitry, that receives and combines said plurality of product signals to provide a combined signal;
   signal integration circuitry, coupled to said second signal combining circuitry, that receives and integrates said combined signal to provide an integrated signal;
   first multifunction processing circuitry, coupled to said signal integration circuitry, that receives and processes said integrated signal to provide a first plurality of processed signals;
   signal complement circuitry, coupled to said first multifunction processing circuitry, that receives and complements said first plurality of processed signals to provide a second plurality of processed signals; and
   second multifunction processing circuitry, coupled to said first multifunction processing circuitry and said signal complement circuitry, that receives and processes said first and second pluralities of processed signals together to provide a plurality of delay interpolation control signals as said at least one delay interpolation control signal.

9. The apparatus of claim 2, wherein said interpolation delay circuitry comprises:
   signal delay circuitry that receives and delays said one of said input data signal and said difference signal to provide a plurality of delayed signals;
   signal multiplication circuitry, coupled to said signal delay circuitry, that receives and multiplies said one of said input data signal and said difference signal, said plurality of delayed signals and said at least one delay interpolation control signal to provide a plurality of product signals; and
   second signal combining circuitry, coupled to said signal multiplication circuitry, that receives and combines said plurality of product signals to provide said interpolated delayed signal.

10. The apparatus of claim 2, wherein:
   said at least one delay interpolation control signal comprises a plurality of delay interpolation control signals;
   said interpolation delay circuitry comprises a plurality of delay circuit stages including
   a first delay circuit stage that receives a first portion of said plurality of delay interpolation control signals and in response thereto receives and interpolates said one of said input data signal and said difference signal as a first one of a plurality of input signals to provide a first one of a plurality of interpolated signals, and
   a last delay circuit stage that receives a last portion of said plurality of delay interpolation control signals and in response thereto receives and interpolates a prior one of said plurality of interpolated signals as a last one of said plurality of input signals to provide said interpolated delayed signal as a last one of said plurality of interpolated signals; and
   each one of said plurality of delay circuit stages comprises
   signal delay circuitry that receives and delays said input signal to provide at least one delayed signal,
   signal multiplication circuitry, coupled to said signal delay circuitry, that receives and multiplies said input signal, said at least one delayed signal and a portion of said plurality of delay interpolation control signals to provide a plurality of product signals, and
   further signal combining circuitry, coupled to said signal multiplication circuitry, that receives and combines said plurality of product signals to provide said interpolated signal.

11. The apparatus of claim 1, wherein said first signal combining circuitry comprises:
   signal delay circuitry that receives and delays said first aligned signal to provide a plurality of delayed signals;
   signal multiplication circuitry, coupled to said signal delay circuitry, that receives and multiplies said first aligned signal, said plurality of delayed signals and said second aligned signal to provide a plurality of product signals; and
   signal integration circuitry, coupled to said signal multiplication circuitry, that receives and integrates said plurality of product signals to provide a plurality of integrated signals as said plurality of adaptive coefficient signals.

12. The apparatus of claim 1, wherein said first signal combining circuitry comprises:
   signal delay circuitry that receives and delays said one of said input data signal and said difference signal to provide a plurality of delayed signals;
   signal multiplication circuitry, coupled to said signal delay circuitry, that receives and multiplies said one of said input data signal and said difference signal, said plurality of delayed signals and said another of said input data signal and said difference signal to provide a plurality of product signals; and
   signal integration circuitry, coupled to said signal multiplication circuitry, that receives and integrates said plurality of product signals to provide a plurality of integrated signals as said plurality of adaptive coefficient signals.

13. An apparatus including an adaptive signal equalizer, comprising:

adaptive equalizer means for receiving at least a plurality of adaptive coefficient signals and in response thereto receiving and equalizing an input data signal and providing an equalized signal;

signal slicer means for slicing said equalized signal and providing a sliced signal and a difference signal corresponding to a difference between said equalized signal and said sliced signal; and adaptive coefficient signal generator means for processing one of said input data signal and said difference signal and providing first and second aligned signals which are substantially temporally aligned, and processing said first and second aligned signals together and providing said plurality of adaptive coefficient signals, wherein said adaptive coefficient signal generator means comprises:

signal delay interpolator means for interpolating said one of said input data signal and said difference signal in response to said plurality of adaptive coefficient signals and providing an interpolated delayed signal; and first signal combiner means for combining said interpolated delayed signal and another of said input data signal and said difference signal and providing said plurality of adaptive coefficient signals.

14. The apparatus of claim 13, wherein said signal delay interpolator means comprises:

interpolation controller means for processing said plurality of adaptive coefficient signals and a plurality of weighted coefficient signals and providing at least one delay interpolation control signal; and interpolation delay means for interpolating said one of said input data signal and said difference signal in response to said at least one delay interpolation control signal and providing said interpolated delayed signal.

15. The apparatus of claim 14, wherein said interpolation controller means comprises:

signal multiplier means for multiplying said plurality of adaptive coefficient signals and said plurality of weighted coefficient signals and providing a plurality of product signals;

second signal combiner means for combining said plurality of product signals and providing a combined signal; and signal integrator means for integrating said combined signal and providing a first one of said at least one delay interpolation control signal.

16. The apparatus of claim 14, wherein said interpolation controller means comprises:

signal multiplier means for multiplying said plurality of adaptive coefficient signals and said plurality of weighted coefficient signals and providing a plurality of product signals;

second signal combiner means for combining said plurality of product signals and providing a combined signal;

signal integrator means for integrating said combined signal and providing an integrated signal; and multifunction processor means for processing said integrated signal and providing a first plurality of delay interpolation control signals as a portion of said at least one delay interpolation control signal.

17. The apparatus of claim 14, wherein said interpolation controller means comprises:

signal multiplier means for multiplying said plurality of adaptive coefficient signals and said plurality of weighted coefficient signals and providing a plurality of product signals;

second signal combiner means for combining said plurality of product signals and providing a combined signal;

signal integrator means for integrating said combined signal and providing an integrated signal;

first multifunction processor means for processing said integrated signal and providing a first plurality of processed signals;

signal complementing means for complementing said first plurality of processed signals and providing a second plurality of processed signals; and second multifunction processor means for processing said first and second pluralities of processed signals together and providing a plurality of delay interpolation control signals as said at least one delay interpolation control signal.

18. The apparatus of claim 14, wherein said interpolation delay means comprises:

signal delay means for delaying said one of said input data signal and said difference signal and providing a plurality of delayed signals;

signal multiplier means for multiplying said one of said input data signal and said difference signal, said plurality of delayed signals and said at least one delay interpolation control signal and providing a plurality of product signals; and second signal combiner means for combining said plurality of product signals and providing said interpolated delayed signal.

19. The apparatus of claim 14, wherein:

said at least one delay interpolation control signal comprises a plurality of delay interpolation control signals;

said interpolation delay means comprises a plurality of delay means including first delay means for interpolating said one of said input data signal and said difference signal in response to a first portion of said plurality of delay interpolation control signals as a first one of a plurality of input signals and providing a first one of a plurality of interpolated signals, and last delay means for interpolating a prior one of said plurality of interpolated signals in response to a last portion of said plurality of delay interpolation control signals as a last one of said plurality of input signals and providing said interpolated delayed signal as a last one of said plurality of interpolated signals; and each one of said plurality of delay means comprises signal delay means for delaying said input signal and providing at least one delayed signal, signal multiplier means for multiplying said input signal, said at least one delayed signal and a portion of said plurality of delay interpolation control signals and providing a plurality of product signals, and further signal combiner means for combining said plurality of product signals and providing said interpolated signal.

20. The apparatus of claim 13, wherein said first signal combiner means comprises:

signal delay means for delaying said first aligned signal and providing a plurality of delayed signals;

signal multiplier means for multiplying said first aligned signal, said plurality of delayed signals and said second aligned signal and providing a plurality of product signals; and signal integrator means for integrating said plurality of product signals and providing a plurality of integrated signals as said plurality of adaptive coefficient signals.

21. A method for adaptive signal equalizing, comprising:

receiving at least a plurality of adaptive coefficient signals and in response thereto receiving and equalizing an input data signal to generate an equalized signal;

slicing said equalized signal to generate a sliced signal and a difference signal corresponding to a difference between said equalized signal and said sliced signal;

processing one of said input data signal and said difference signal to generate first and second aligned signals which are substantially temporally aligned; and processing said first and second aligned signals together to generate said plurality of adaptive coefficient signals, wherein said interpolating said one of said input data signal and said difference signal to generate an interpolated delayed signal comprises:

processing said plurality of adaptive coefficient signals and a plurality of weighted coefficient signals to generate at least one delay interpolation control signal; and interpolating said one of said input data signal and said difference signal in response to said at least one delay interpolation control signal to generate said interpolated delayed signal.

22. The method of claim 21, wherein said processing said plurality of adaptive coefficient signals and a plurality of weighted coefficient signals to generate at least one delay interpolation control signal comprises processing said plurality of adaptive coefficient signals and a plurality of weighted coefficient signals to generate first and second delay interpolation control signals, wherein said second delay interpolation control signal is a complement of said first delay interpolation control signal.

23. The method of claim 21, wherein said processing said plurality of adaptive coefficient signals and a plurality of weighted coefficient signals to generate at least one delay interpolation control signal comprises:

multiplying said plurality of adaptive coefficient signals and said plurality of weighted coefficient signals to generate a plurality of product signals;

combining said plurality of product signals to generate a combined signal; and integrating said combined signal to generate a first one of said at least one delay interpolation control signal.

24. The method of claim 23, further comprising complementing said first one of said at least one delay interpolation control signal to generate a second one of said at least one delay interpolation control signal.

25. The method of claim 21, wherein said processing said plurality of adaptive coefficient signals and a plurality of weighted coefficient signals to generate at least one delay interpolation control signal comprises:

multiplying said plurality of adaptive coefficient signals and said plurality of weighted coefficient signals to generate a plurality of product signals;

combining said plurality of product signals to generate a combined signal;

integrating said combined signal to generate an integrated signal; and processing said integrated signal to generate a first plurality of delay interpolation control signals as a portion of said at least one delay interpolation control signal.

26. The method of claim 25, further comprising complementing said first plurality of delay interpolation control signals to generate a second plurality of delay interpolation control signals as another portion of said at least one delay interpolation control signal.

27. The method of claim 21, wherein said processing said plurality of adaptive coefficient signals and a plurality of weighted coefficient signals to generate at least one delay interpolation control signal comprises:

multiplying said plurality of adaptive coefficient signals and said plurality of weighted coefficient signals to generate a plurality of product signals;

combining said plurality of product signals to generate a combined signal;

integrating said combined signal to generate an integrated signal;

processing said integrated signal to generate a first plurality of processed signals;

complementing said first plurality of processed signals to generate a second plurality of processed signals; and processing said first and second pluralities of processed signals together to generate a plurality of delay interpolation control signals as said at least one delay interpolation control signal.

28. The method of claim 21, wherein said interpolating said one of said input data signal and said difference signal in response to said at least one delay interpolation control signal to generate said interpolated delayed signal comprises:

delaying said one of said input data signal and said difference signal to generate a plurality of delayed signals;

multiplying said one of said input data signal and said difference signal, said plurality of delayed signals and said at least one delay interpolation control signal to generate a plurality of product signals; and combining said plurality of product signals to generate said interpolated delayed signal.

29. The method of claim 21, wherein:

said processing said plurality of adaptive coefficient signals and a plurality of weighted coefficient signals to generate at least one delay interpolation control signal comprises processing said plurality of adaptive coefficient signals and a plurality of weighted coefficient signals to generate a plurality of delay interpolation control signals;

said interpolating said one of said input data signal and said difference signal in response to said at least one delay interpolation control signal to generate said interpolated delayed signal comprises interpolating said one of said input data signal and said difference signal as a first one of a plurality of input signals to generate a first one of a plurality of interpolated signals in response to a first portion of said plurality of delay interpolation control signals, and interpolating a prior one of said plurality of interpolated signals as a last one of said plurality of input signals to generate said interpolated delayed signal as a last one of said plurality of interpolated signals in response to a last portion of said plurality of delay interpolation control signals, by delaying said input signal to generate at least one delayed signal, multiplying said input signal, said at least one delayed signal and a portion of said plurality of delay interpolation control signals to generate a plurality of product signals, and combining said plurality of product signals to generate said interpolated signal.

* * * * *